(12) United States Patent
Wang et al.

(10) Patent No.: US 12,374,602 B2
(45) Date of Patent: Jul. 29, 2025

(54) SEMICONDUCTOR STRUCTURE HAVING THROUGH SUBSTRATE VIA AND MANUFACTURING METHOD THEREOF

(71) Applicant: Taiwan Semiconductor Manufacturing Company, Ltd., Hsinchu (TW)

(72) Inventors: Wei-Ming Wang, Taichung (TW); Yu-Hung Lin, Taichung (TW); Yu-Hsiao Lin, Taoyuan (TW); Shih-Peng Tai, Hsinchu County (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 541 days.

(21) Appl. No.: 17/727,820

(22) Filed: Apr. 25, 2022

(65) Prior Publication Data
US 2023/0343677 A1   Oct. 26, 2023

(51) Int. Cl.
| | | |
|---|---|---|
| H01L 23/48 | (2006.01) | |
| H01L 21/768 | (2006.01) | |
| H01L 23/00 | (2006.01) | |
| H01L 23/522 | (2006.01) | |
| H01L 23/528 | (2006.01) | |
| H01L 25/10 | (2006.01) | |

(52) U.S. Cl.
CPC ...... *H01L 23/481* (2013.01); *H01L 21/76877* (2013.01); *H01L 21/76898* (2013.01); *H01L 23/5226* (2013.01); *H01L 23/5283* (2013.01); *H01L 24/05* (2013.01); *H01L 24/13* (2013.01); *H01L 25/105* (2013.01); *H01L 2224/0557* (2013.01); *H01L 2224/13025* (2013.01); *H01L 2225/1058* (2013.01)

(58) Field of Classification Search
None
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

(Continued)

*Primary Examiner* — Cory W Eskridge
(74) *Attorney, Agent, or Firm* — JCIPRNET

(57) ABSTRACT

A semiconductor structure includes a dielectric layer, a conductive pad embedded in the dielectric layer, a semiconductor substrate disposed on the dielectric layer and including a via opening with a notch in proximity to the dielectric layer, a through substrate via (TSV) disposed in the via opening of the semiconductor substrate and extending into the dielectric layer to land on the conductive pad, and a dielectric liner disposed in the via opening of the semiconductor substrate and filling the notch to laterally separate the TSV from the semiconductor substrate. A surface of the dielectric liner facing the TSV is substantially leveled with an inner sidewall of the dielectric layer facing the TSV.

20 Claims, 8 Drawing Sheets

(56) References Cited

U.S. PATENT DOCUMENTS

2018/0068949 A1\* 3/2018 Chen .................... H01L 21/0228
2018/0286782 A1\* 10/2018 Noda ................... H01L 23/5283
2019/0148287 A1\* 5/2019 Chang ................. H01L 23/5283
                                                        257/368
2021/0242158 A1\* 8/2021 Lee ..................... H01L 21/6835

\* cited by examiner

SEMICONDUCTOR STRUCTURE HAVING THROUGH SUBSTRATE VIA AND MANUFACTURING METHOD THEREOF

BACKGROUND

In recent years, the semiconductor industry has experienced rapid growth due to continuous improvement in integration density of various electronic components. For the most part, this improvement in integration density has come from successive reductions in minimum feature size, which allows more components to be integrated into a given area. However, there are physical limitations to an achievable density in two-dimensional (2D) integrated circuits formation. As semiconductor technologies further advance, 3D integrated circuits (3DICs) have emerged as an effective alternative to further reduce the physical size of a die. One major challenge of 3D interconnects is the formation of through-substrate vias (TSVs) which penetrate through substrates and are used to electrically inter-couple features on opposite sides of the substrates. Accordingly, there is continuous effort in developing new mechanisms of forming semiconductor structures having improved electrical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-2A, 3A, 4A-4B, 5A, and 6A are schematic cross-sectional views showing stages of forming a semiconductor structure having a through substrate via, in accordance with some embodiments.

DETAILED DESCRIPTION

Figure 1:
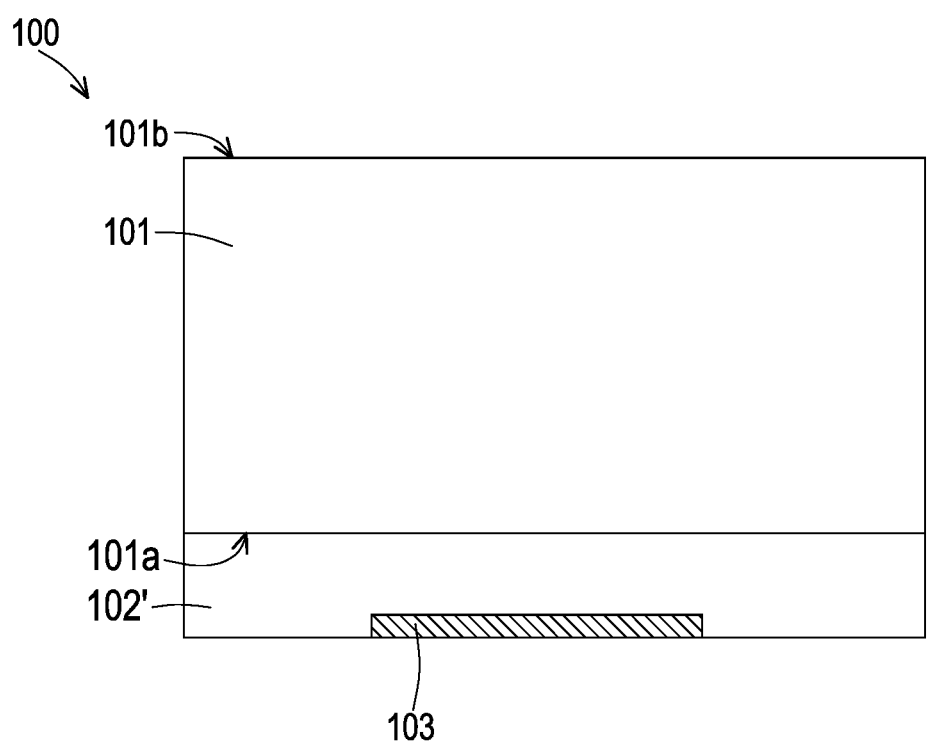

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A via structure and the method of forming the same, which may be applied to a through-substrate via process (e.g., through-silicon via or through-wafer via process) for forming a vertical interconnection on the stacked wafers/dies, are provided in accordance with some embodiments. The intermediate stages of manufacturing an embodiment are illustrated in FIGS. 1-6B. In some embodiments, the via formation process is performed after the formation of the FEOL devices and the interconnect structure. In some embodiments, the via formation process is performed before wafer-to-wafer bonding. It is understood that specific embodiments are provided as examples to teach the broader inventive concept, and variations are fully intended to be included within the scope of the embodiments presented.

FIGS. 1-2A, 3A, 4A-4B, 5A, and 6A are schematic cross-sectional views showing stages of forming a semiconductor structure having a through substrate via, and FIGS. 2B, 3B, 5B, and 6B are schematic top views showing the structures in FIGS. 2A, 3A, 5A, and 6A, respectively, in accordance with some embodiments.

Referring to FIG. 1, a portion of a semiconductor structure 100 is shown. The semiconductor structure 100 may be a part of a wafer such as a device wafer including active devices and possibly passive devices. For example, the semiconductor structure 100 includes a plurality of chips/die regions therein. In alternative embodiments, the semiconductor structure 100 is a part of an interposer wafer, which is free from active devices, and may or may not include passive devices. The semiconductor structure 100 may include a semiconductor substrate 101 having a front side 101a and a backside 101b opposite to each other. The semiconductor substrate 101 may be formed of or include crystalline silicon, crystalline germanium, silicon germanium, carbon-doped silicon, or a III-V compound semiconductor such as GaAsP, AlInAs, AlGaAs, GaInAs, GaInP, GaInAsP, or the like.

In some embodiments, the semiconductor structure 100 includes integrated circuit devices (not individually shown), which are formed on the front side 101a of the semiconductor substrate 101. The integrated circuit devices may include transistors, resistors, capacitors, diodes, and the like. The details of integrated circuit devices are not illustrated herein. In some embodiments, shallow Trench Isolation (STI) regions (not shown) may be formed in the semiconductor substrate 101 to isolate the active regions in the semiconductor substrate 101. In alternative embodiments, the semiconductor structure 100 is used for forming interposers (which are free from active devices), and the semiconductor substrate 101 is a silicon substrate or a dielectric substrate.

In some embodiments, the semiconductor structure 100 includes a dielectric material layer 102' underlying the front side 101a of the semiconductor substrate 101. The dielectric material layer 102' may be a single layer or may include multiple sublayers having different dielectric materials. In some embodiments, the dielectric material layer 102' is formed of silicon oxide, undoped silicate glass (USG), Phospho Silicate Glass (PSG), Boro Silicate Glass (BSG), Boron-doped Phospho Silicate Glass (BPSG), Fluorine-doped Silicate Glass (FSG), combinations thereof, and/or the like. In some embodiments, the dielectric material layer 102' may be or include inter-layer dielectric (ILD) which fills the spaces between the gate stacks of transistors (not shown) in integrated circuit devices. In some embodiments, the dielectric material layer 102' may be or include may be inter-metallization dielectric (IMD) layers which may be formed of, e.g., a low-K dielectric material. In some embodiments, the dielectric material layer 102' is referred to as front-side oxide film. In some embodiments, a conductive pad 103 is embedded in the dielectric material layer 102'. The conductive pad 103 may be a copper pad, an aluminum pad, or an aluminum-copper pad, and other metallic materials may be used.

Figure 2A:
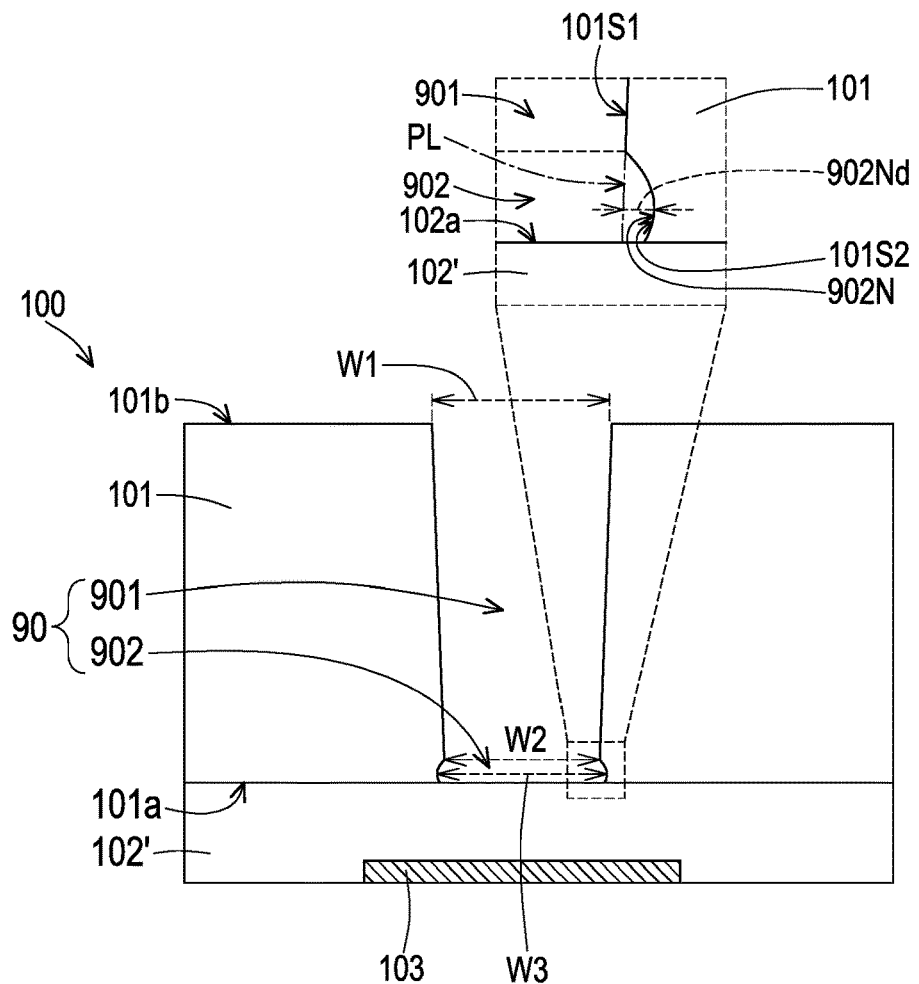
Figure 2B:
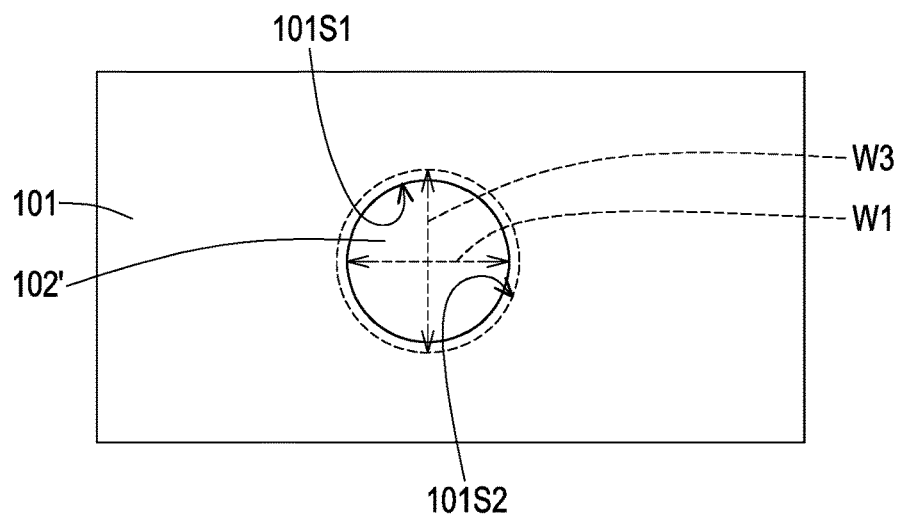
FIGS. 2B, 3B, 5B, and 6B are schematic top views showing the structures in FIGS. 2B, 3A, 5A, and 6A, respectively, in accordance with some embodiments.

Referring to FIGS. 2A-2B, the semiconductor structure 100 shows that a via opening 90 penetrates through the semiconductor substrate 101 and accessibly exposes at least a portion of a top surface 102a of the dielectric material layer 102'. The formation of the via opening 90 may involve photolithography definition of an area on the back side 101b of the semiconductor substrate 101 and substrate etching. For example, the via opening 90 is formed through a suitable etching process, such as a plasma etching (e.g., reactive ion etching (RIE)) or other dry etch, an isotropic or anisotropic wet etch, or any other suitable etching process may be applied. In the top view of FIG. 2B, the via opening 90 may be of a round shape. Alternatively, the via opening 90 may have a rectangular shape, or any other polygon shape (e.g., a hexagon shape or an octagon shape), in the top view. In the cross-section of FIG. 2A, the via opening 90 may have an upper region 901 and a lower region 902 below and connected to the upper region 901. For example, the upper region 901 extends from the back side 101b of the semiconductor substrate 101 and is defined by an upper sidewall 101S1 of the semiconductor substrate 101, and the lower region 902 stops at the dielectric material layer 102' and is defined by a lower sidewall 101S2 of the semiconductor substrate 101.

In some embodiments, the upper region 901 is tapered from the back side 101b of the semiconductor substrate 101 toward the lower region 902. In some embodiments, a top opening width W1 of the upper region 901 is greater than a bottom opening width W2 of the upper region 901. The upper sidewall 101S1 in the cross-section may exhibit a slanted straight line. The lower region 902 may have an undercut. For example, the lower region 902 exhibits an indentation or a notch 902N in the cross section. For example, the lower sidewall 101S2 in the cross-section may exhibit a concave curve with a recess facing the interior of the via opening 90. The notch 902N gives a cross-sectional profile to opposing inner sidewalls of the semiconductor substrate 101 that define bottom sides of the via opening 90.

In some embodiments, the notch 902N has a rounded profile as viewed along the cross-sectional view, thereby giving the notch a curved triangular profile. The notch 902N may extend to a maximum depth 902Nd from a virtual plane PL on which the upper sidewall 101S1 is disposed to an adjacent sidewall of the semiconductor substrate 101. For example, the maximum depth 902Nd ranges from about 0.1 μm to about 0.5 μm. The maximum depth 902Nd of the notch 902N may give the lower region 902 of the via opening 90 a maximum width W3, where the maximum width W3 is greater than the top opening width W1 and also greater than the bottom opening width W2.

Figure 3A:
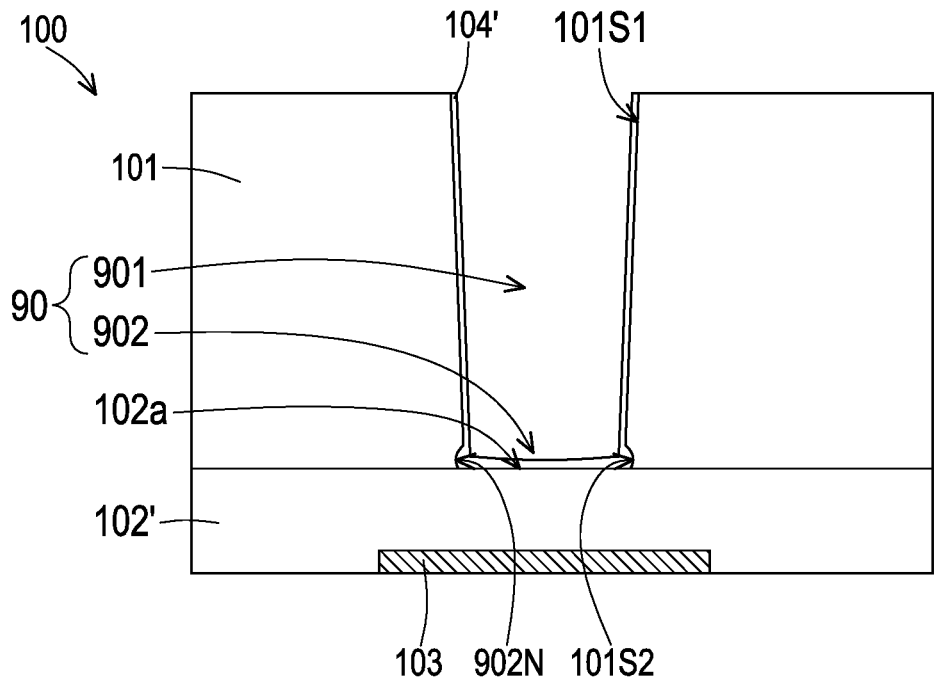
Figure 3B:
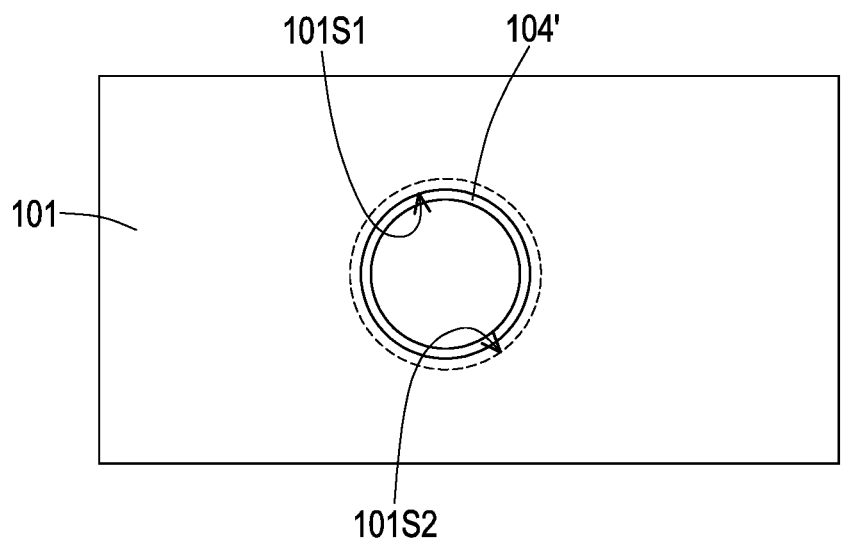

Referring to FIGS. 3A-3B, the semiconductor structure 100 includes a dielectric liner material 104' formed in the via opening 90. For example, the dielectric liner material 104' is deposited on the upper sidewall 101S1 and the lower sidewall 101S2 of the semiconductor substrate 101 and also deposited on the top surface 102a of the dielectric material layer 102'. In some embodiments, the dielectric liner material 104' substantially fills the notch 902N of the via opening 90. In the top view of FIG. 3B, an upper portion of the dielectric liner material 104' is formed on the upper region 901 of the via opening 90 and overlies the upper sidewall 101S1 of the semiconductor substrate 101, and a lower portion of the dielectric liner material 104' is formed on the lower region 902 of the via opening 90 and extends across the exposed top surface of the dielectric material layer 102' within the via opening 90. In some embodiments, an upper portion of the dielectric liner material 104' formed on the upper region 901 is thinner than a lower portion of the dielectric liner material 104' formed on the lower region 902. The thickness of the upper portion of the dielectric liner material 104' formed on the upper sidewall 101S1 of the semiconductor substrate 101 may range from about 2000 angstroms to about 6000 angstroms. For example, a horizontal portion of the dielectric liner material 104' overlying the top surface 102a of the dielectric material layer 102' is thicker than the upper portion of the dielectric liner material 104' formed on the upper sidewall 101S1 of the semiconductor substrate 101.

The dielectric liner material 104' may be a single layer or may include multiple sublayers having different dielectric materials, and may be formed by chemical vapor deposition (CVD), plasma-enhanced CVD (PECVD), high-density plasma chemical vapor deposition (HDP-CVD), or any suitable deposition process. The dielectric liner material 104' may be or may include an oxide (e.g., silicon oxide), a nitride (e.g., silicon nitride (SiN)), silicon oxynitride (SiON), or a combination thereof, etc. In some embodiments, the dielectric liner material 104' and the dielectric material layer 102' are formed of the same (or similar) material(s). In some embodiments where the dielectric liner material 104' and/or the dielectric material layer 102' include multiple sublayers, the outermost sublayer of the dielectric liner material 104' and the outermost sublayer of the dielectric material layer 102' are formed of the same (or similar) material(s).

Figure 4A:
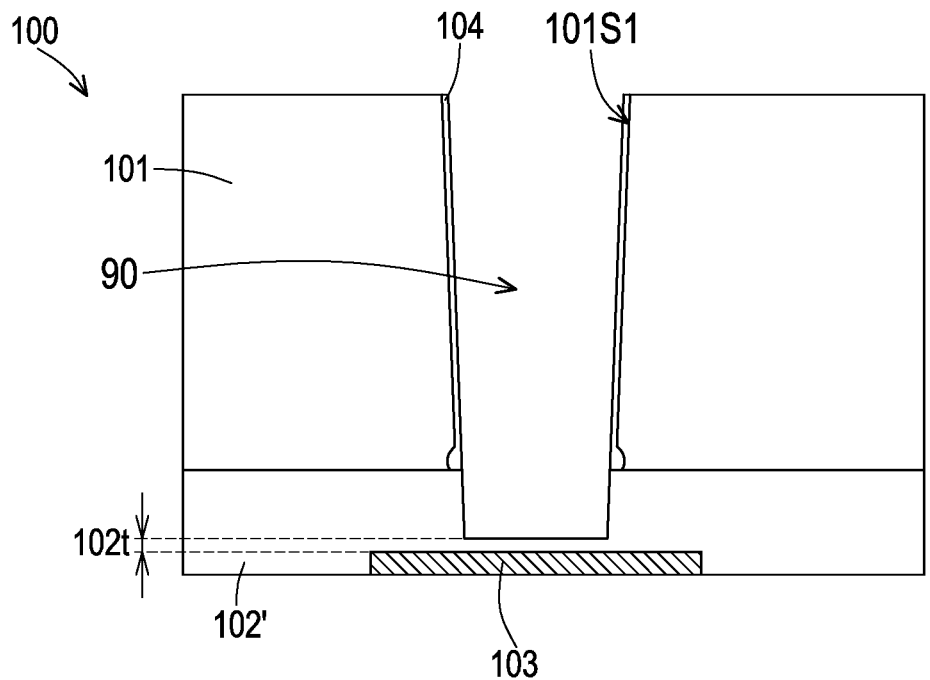
Figure 4B:
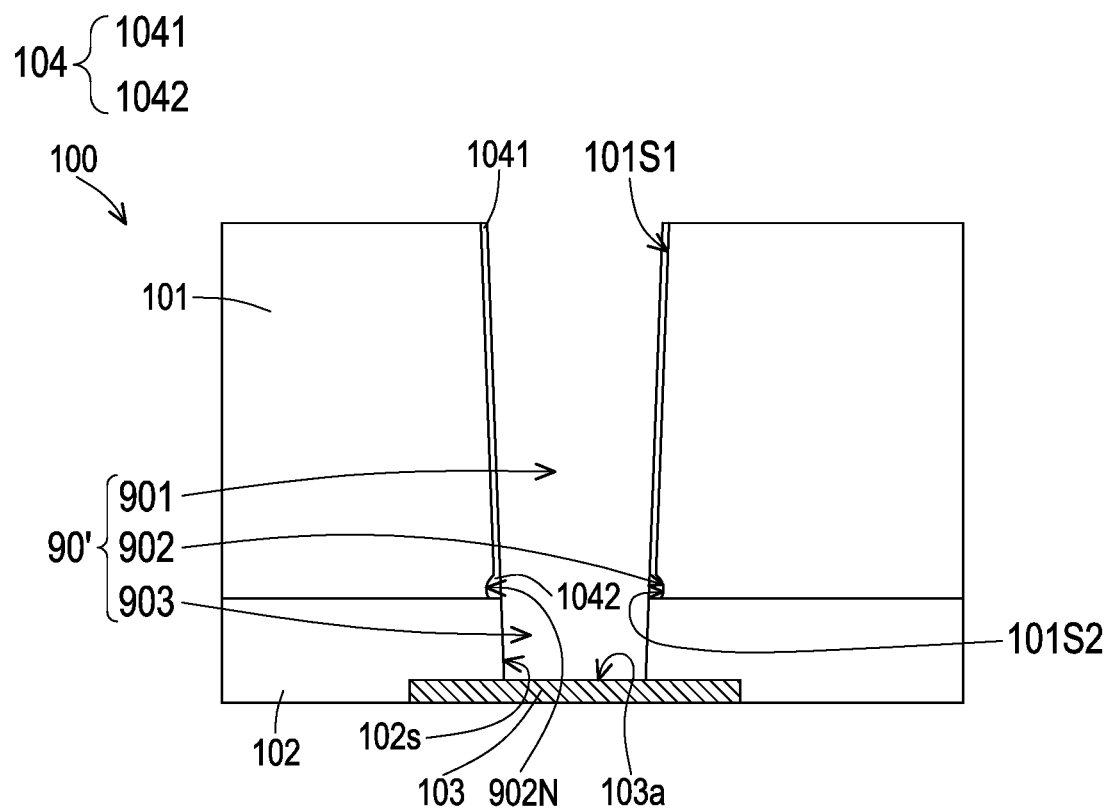

Referring to FIGS. 4A-4B and with reference to FIG. 3A, the semiconductor structure 100 includes an extended via opening 90' which accessibly reveals the conductive pad 103. For example, a bottom portion of the dielectric liner material 104' and a portion of the dielectric material layer 102' underlying the bottom portion of the dielectric liner material 104' are removed to form a dielectric liner 104 and a dielectric layer 102, respectively. In some embodiments, one or more etching process is used. For example, the etching process is a two-step etching process in which the bottom portion of the dielectric liner material 104' and a portion of the underlying dielectric material layer 102' may be etched away in a first etching step (as shown in FIG. 4A), and then a remaining portion of the dielectric material layer 102' left on the conductive pad 103 is etched away in a second etching step which stops at the conductive pad 103 (as shown in FIG. 4B).

In some embodiments, at the first etching step, a dry etching process is performed to remove the horizontal portion of the dielectric liner material 104'. During the dry etching process, a portion of the underlying dielectric material layer 102' may be removed together with the horizontal portion of the dielectric liner material 104'. After the dry etching process, a remaining portion of the dielectric material layer 102' having a thickness 102t may be left on the conductive pad 103, where the thickness 102t is non-zero. Subsequently, at the second etching step, a wet etching process may be performed to remove the remaining portion of the dielectric material layer 102' until at least a portion of a top surface 103a of the conductive pad 103 is accessibly revealed. In this manner, there will be no damage to the conductive pad 103 during the pad revealing step. In alternative embodiments, a single dry etching process is performed on the structure shown in FIG. 3A and directly leads to the structure shown in FIG. 4B. That is, the process illustrated in FIG. 4A may be omitted. In such case, precise control is needed to effectively remove the dielectric liner material 104' and the underlying dielectric material layer 102' without damaging the conductive pad 103.

As shown in FIG. 4B, after the etching, the dielectric liner 104 remains on the upper sidewall 101S and the lower sidewall 101S2 of the semiconductor substrate 101. For example, the upper portion 1041 of the dielectric liner 104 covers the upper sidewall 101S1, while the lower portion 1042 of the dielectric liner 104 covers the lower sidewall 101S2. The notch 902N of the extended via opening 90' may be filled by the dielectric liner 104. The bottommost region 903 of the extended via opening 90' below and connected to the lower region 902 may be defined by the inner sidewall 102s of the dielectric layer 102. In some embodiments, the outer surface of the dielectric liner 104 is substantially leveled (or coplanar) with the inner sidewall 102s of the underlying dielectric layer 102, within process variations. In other words, no significant recess caused by the notch 902N is formed on the outer surface of the dielectric liner 104. The outer surface of the dielectric liner 104 and the inner sidewall 102s of the underlying dielectric layer 102 form a smooth cross-sectional profile for the formation of the through substrate via. As compared with the inner sidewall of the semiconductor substrate 101, the surface roughness of the outer surface of the dielectric liner is less than that of the inner sidewall of the semiconductor substrate 101, since the inner sidewall of the semiconductor substrate 101 is recessed to form the notch 902N.

Figure 5A:
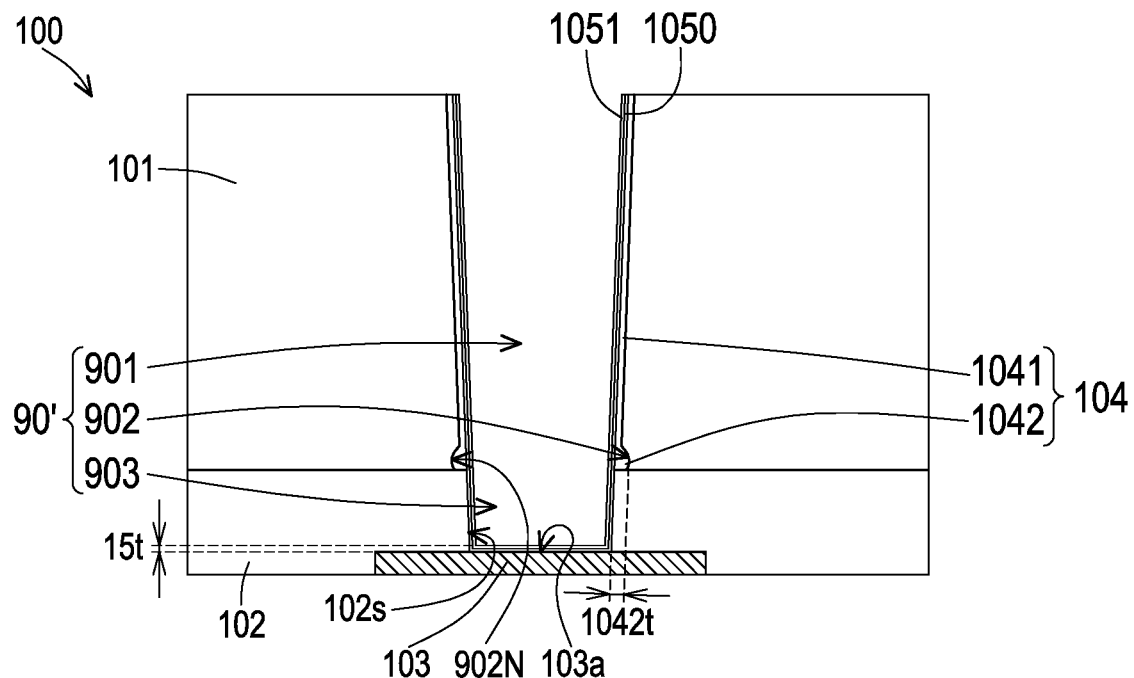
Figure 5B:
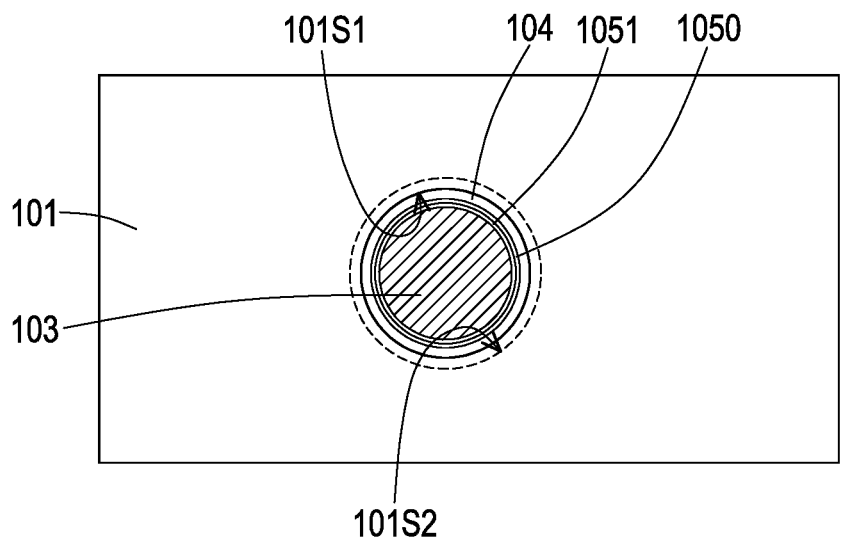

Referring to FIGS. 5A-5B, the semiconductor structure 100 includes a diffusion barrier layer 1050 and a seed layer 1051 conformally formed in the extended via opening 90'. The diffusion barrier layer 1050 may be formed on the dielectric liner 104 and extends to cover the inner sidewall 102s of the dielectric layer 102, and the diffusion barrier layer 1050 may also extend to cover the top surface 103a of the conductive pad 103. For example, the diffusion barrier layer 1050 is in direct contact with the dielectric liner 104, the underlying dielectric layer 102, and the conductive pad 103. The diffusion barrier layer 1050 may include TaN, Ta, TiN, Ti, CoW, or the like, and may be formed in the extended via opening 90' by any suitable deposition process. The diffusion barrier layer 1050 may be a single layer or may include multiple sublayers having different materials. In the top view of FIG. 5B, the diffusion barrier layer 1050 is encircled by the dielectric liner 104. In other words, the dielectric liner 104 is interposed between the semiconductor substrate 101 and the diffusion barrier layer 1050. In the top view and the cross-sectional view, the lower portion 1042 of the dielectric liner 104 surrounds the diffusion barrier layer 1050 in annular manner. The lower portion 1042 of the dielectric liner 104 may be viewed as an annular dielectric ring interposed between the semiconductor substrate 101 and the diffusion barrier layer 1050.

After the diffusion barrier layer 1050 is deposited, the seed layer 1051 may be conformally deposited on the diffusion barrier layer 1050. The seed layer 1051 may be a thin layer of a conductive material that aids in the formation of a thicker layer during subsequent processing steps. The seed layer 1051 may be a Ti/Cu bilayer, a copper layer, or other suitable metal layer, and may be formed by using thin-film deposition such as PVD, e.g., sputtering, evaporation e.g., e-beam evaporation, or any suitable deposition process. Alternatively, the diffusion barrier layer 1050 is omitted. In some embodiments, the thickness 15t of the seed layer 1051 (alone or in combination with the diffusion barrier layer 1050) ranges from about 50 angstroms to about 250 angstroms. In some embodiments, the thickness 15t of the seed layer 1051 (alone or in combination with the diffusion barrier layer 1050) is less than the maximum thickness 1042t of the lower portion 1042 of the dielectric liner 104 formed in the notch 902N.

Figure 6A:
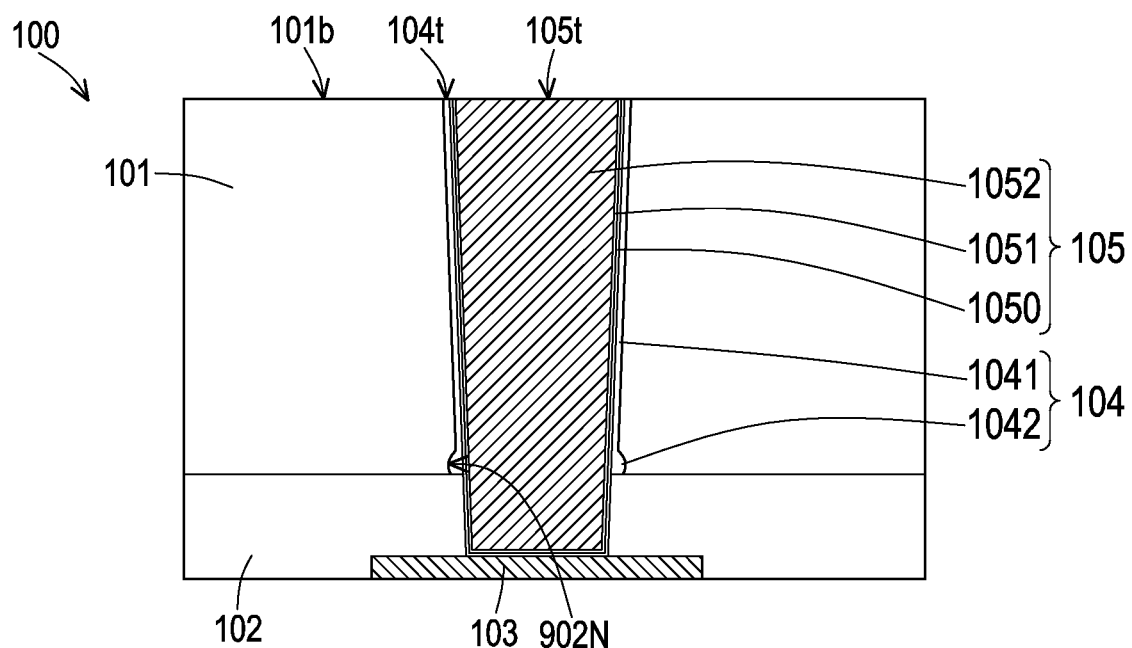
Figure 6B:
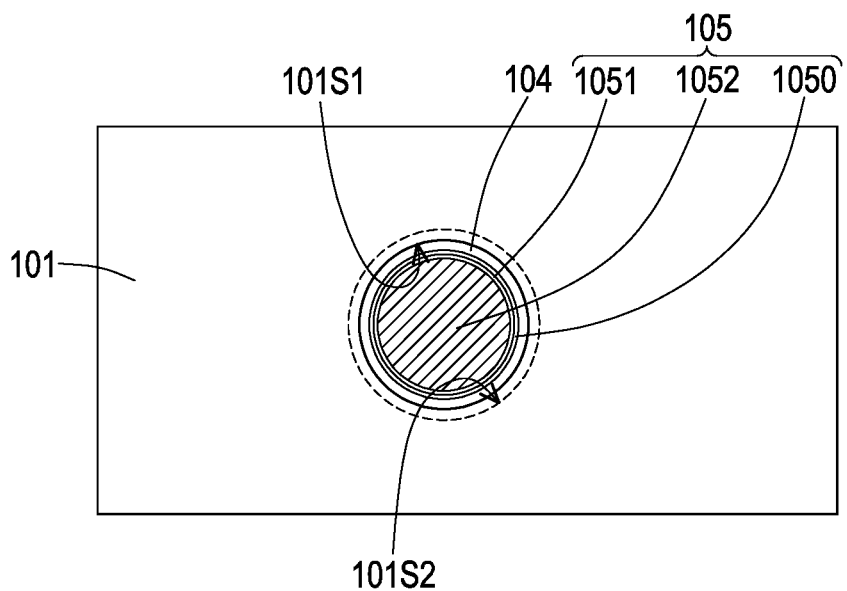

Referring to FIGS. 6A-6B and with reference to FIG. 5A, the semiconductor structure 100 includes a conductive material layer 1052 formed on the seed layer 1051 and filling the extended via opening 90'. In the top view, the conductive material layer 1052 may be encircled by the seed layer 1051, and the seed layer 1051 is interposed between the conductive material layer 1052 and the diffusion barrier layer 1050. The conductive material layer 1052, the seed layer 1051, and the diffusion barrier layer 1050 may be collectively viewed as a through substrate via (TSV) 105. The lower portion 1042 of the dielectric liner 104 forms an annular dielectric ring surrounding the TSV 105. The conductive material layer 1052 may include copper, aluminum, nickel, tungsten, cobalt, silver, combinations thereof, or the like, and may be formed over the seed layer 1051 by an electro-chemical plating process, CVD, PVD, a combination thereof, or any suitable deposition process. In some embodiments, after forming the conductive material layer 1052, excess materials of the conductive material layer 1052, the seed layer 1051, the diffusion barrier layer 1050, and the dielectric liner 104 overlying the back side 101b of the semiconductor substrate 101 may be removed by a planarization process (e.g., chemical mechanical polishing (CMP), grinding, etching, a combination thereof, or the like). Thereafter, the top surface 105t of the TSV 105 may be substantially leveled (or coplanar) with the top surface 104t of the dielectric liner 104 and the back side 101b of the semiconductor substrate 101, within process variations.

Figure 7:
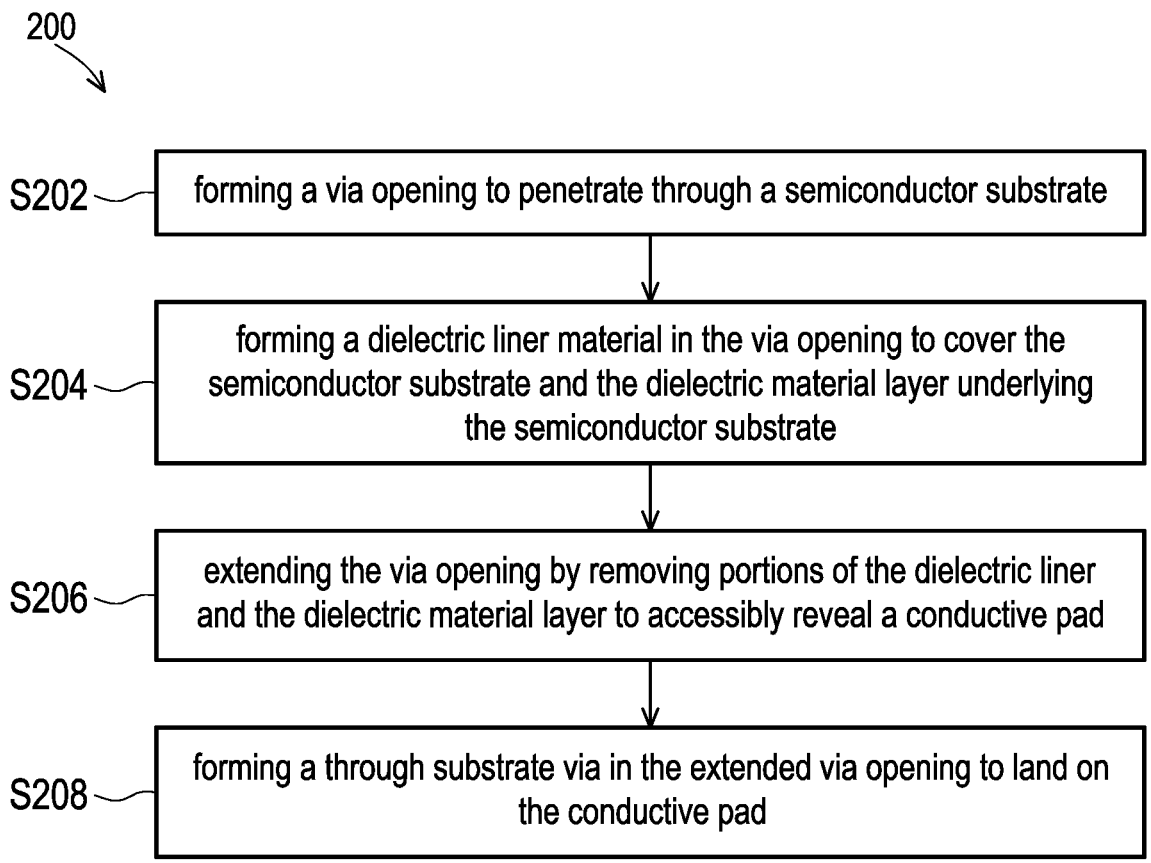
FIG. 7 is a flow diagram illustrating a manufacturing method of a through substrate via in a semiconductor structure, in accordance with some embodiments.

FIG. 7 is a flow diagram illustrating a manufacturing method of a through substrate via in a semiconductor structure, in accordance with some embodiments. Referring to FIG. 7, a method 200 is provided. It is noted that the method 200 including the following operations is merely an example, and construes no limitation in the disclosure. While the method 200 is illustrated and described below as a series of acts or operations, it should be understood that additional operation(s) may be provided before, during, and after the method 200, certain operation(s) may be performed concurrently with other operations, and certain operation(s) may be omitted or may only be briefly described herein.

At the step S202, a via opening is formed to penetrate through a semiconductor substrate, where the via opening includes the lower region having a notch (or indentation) recessed in the sidewall of the semiconductor substrate. For example, the descriptions related to FIGS. 1, 2A, and 2B correspond to the step S202. At the step S204, a dielectric liner material is formed in the via opening to cover the sidewall of the semiconductor substrate and the top surface of dielectric material layer underlying the semiconductor substrate, where the dielectric liner material fills the notch of the lower region of the via opening. For example, the descriptions related to FIGS. 3A-3B correspond to the step S204.

At the step S206, the via opening is extended by removing a bottom portion of the dielectric liner and the underlying portion of the dielectric material layer to accessibly reveal a conductive pad that were buried in the dielectric material layer, where the removal involves using the two-step etching process or the single dry etching process. For example, the descriptions related to FIGS. 4A-4B correspond to the step S206. At the step S208, a TSV is formed in the extended via opening to land on the conductive pad, where the TSV includes the seed layer overlying the dielectric liner and the conductive material layer overlying the seed layer. For example, the descriptions related to FIGS. 5A-5B correspond to the step S208.

It should be understood that the method of forming a via opening penetrating through the semiconductor substrate and the underlying dielectric material layer to reveal the conductive pad in one-time may cause the dielectric liner having a recess at the notch of the semiconductor substrate, and the subsequently-formed diffusion barrier layer and the seed layer may also have an indentation corresponding to the recess of the dielectric liner. In addition, etching the semiconductor substrate and the underlying dielectric material layer in one-time may accumulate plasma charging on the conductive pad, thereby having the arcing risk. These issues may render a poor cross-sectional profile of the via opening and will negatively affect the formation of the TSV. On the contrary, the embodiments of the present disclosure have some advantageous features. By forming the dielectric liner material in the via opening and on the top surface of the dielectric material layer, the notch of the semiconductor substrate may be filled by the dielectric liner material. Therefore, after removing the bottom portion of the dielectric liner material and the underlying portion of the dielectric material layer to reveal the conductive pad, a better (or smoother) profile of the extended via opening for the formation of TSV is obtained. In addition, the damage to the conductive pad by plasma may be eliminated (or minimized) by using the aforementioned method.

Figure 8:
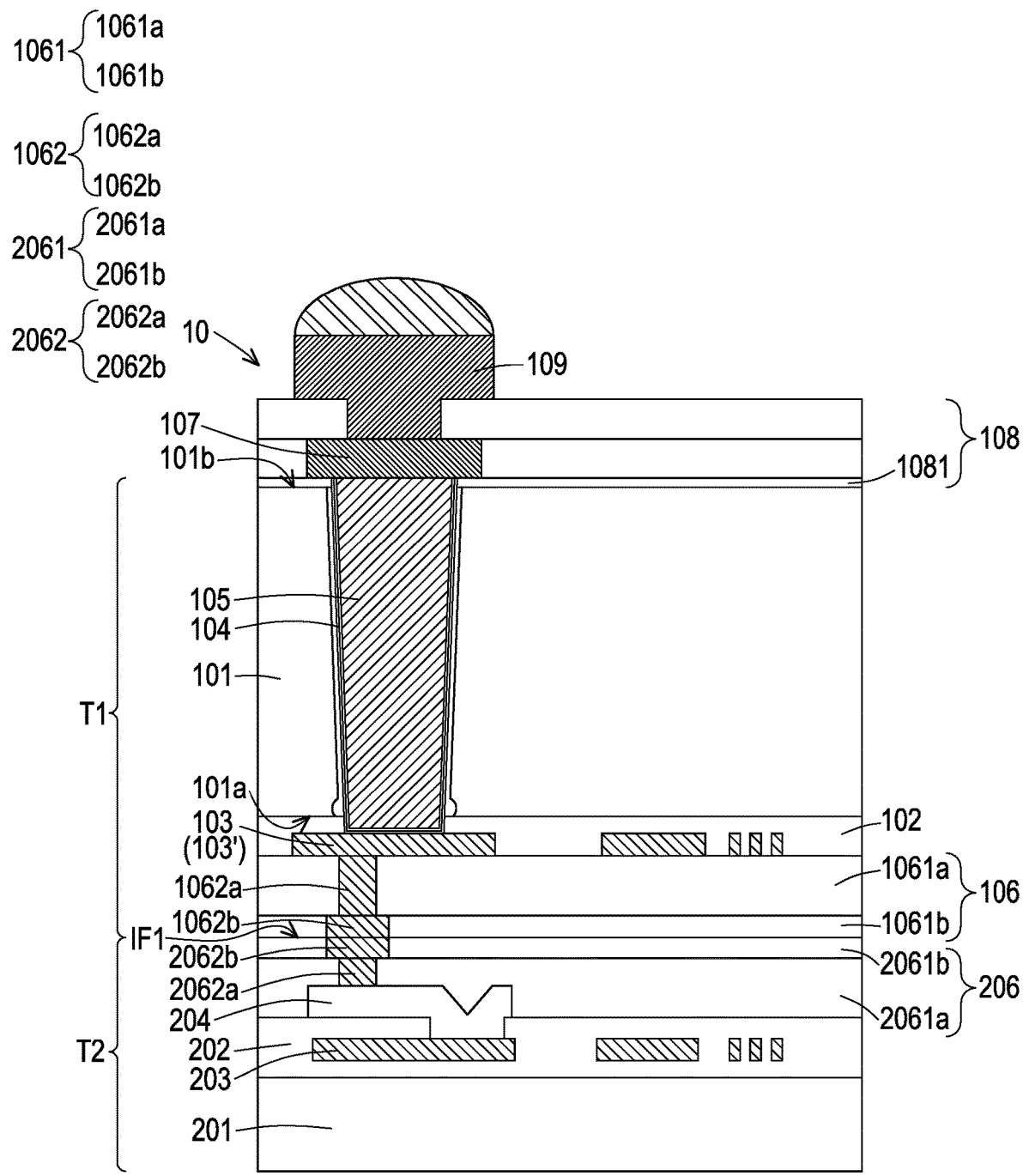
FIG. 8 is a schematic cross-sectional view showing a semiconductor device having a through substrate via in accordance with some embodiments.

FIG. 8 is a schematic cross-sectional view showing a semiconductor device having a through substrate via in accordance with some embodiments. Unless specified otherwise, the materials and the formation methods of the components in these embodiments are essentially the same as the like components, which are denoted by like reference numerals in the embodiments. Referring to FIG. 8, a semiconductor device 10 is provided. For example, the semiconductor device 10 includes a first tier T1 and a second tier T2 below and bonded to the first tier T1. The first tier T1 may include the semiconductor substrate 101, the dielectric layer 102 underlying the semiconductor substrate 101, a conductive pattern 103' including the conductive pad 103 and embedded in the dielectric layer 102, the TSV 105 penetrating through the semiconductor substrate 101 and extending into the dielectric layer 102 to land on the conductive pad 103, and the dielectric liner 104 laterally interposed between the semiconductor substrate 101 and the TSV 105. The semiconductor substrate 101, the dielectric layer 102, the dielectric layer 102, the dielectric liner 104, and the TSV 105 are similar to the corresponding elements described in the preceding paragraphs, and thus the detailed descriptions are not repeated for the sake of brevity.

The conductive pattern 103' may further include conductive lines and conductive vias (not shown) for electrical connection. In some embodiments, the dielectric layer 102 and the conductive pattern 103' are collectively viewed as an interconnect structure, where the dielectric layer 102 is referred to as interconnect dielectric layer and the conductive pattern 103' is referred to as an interconnect circuitry. The conductive pad 103 may be at the first metallization level (M1) of the interconnect circuitries or may be at the topmost metallization level (Mt) of the interconnect circuitries. It should be noted that the configuration of the dielectric layer 102 and the conductive pattern 103' shown herein is merely an example, the interconnect structure may include multiple levels of the interconnect dielectric layers and the interconnect circuitries embedded in the interconnect dielectric layers. The integrated circuit devices (not shown) formed in/on the semiconductor substrate 101 and the conductive pattern 103' may be interconnected to perform one or more functions including memory structures, processing structures, sensors, amplifiers, power distribution, input/output circuitry, or the like.

The first tier T1 may further include a bonding structure 106. For example, the bonding structure 106 includes a bonding dielectric layer 1061 and at least one bonding connector 1062 embedded in the bonding dielectric layers 1061. In some embodiments, the bonding dielectric layer 1061 includes a first dielectric sublayer 1061a underlying the dielectric layer and a second dielectric sublayer 1061b underlying the first dielectric sublayer 1061a. For example, the first dielectric sublayer 1061a is formed of a dielectric material such as USG, PSG, BPSG, FSG, silicon oxide, silicon nitride, silicon carbide, silicon oxynitride, compounds thereof, composites thereof, combinations thereof, and/or the like. A material of the second dielectric sublayer 1061b may be or may include silicon oxide (e.g., TEOS formed oxide), silicon nitride, silicon oxynitride, or the like. It should be noted that the bonding dielectric layer 1061 illustrated herein is merely an example, a single dielectric layer or more than two sublayers may be used.

In some embodiments, the bonding connector 1062 includes a via portion 1062a laterally covered by the first dielectric sublayer 1061a and a pad portion 1062b connected to the via portion 1062a and laterally covered by the second dielectric sublayer 1061b. The via portion 1062a and the pad portion 1062b may be formed of a metal that facilitates metal-to-metal bonding, such as copper, a copper alloy, or other suitable conductive material, and may be formed using a dual damascene process. It should be noted that the bonding connector illustrated herein is merely an example, the bonding connector can only have the via portion formed by using a single damascene process, or more than one bonding connectors may be formed. In some embodiments, the lower surfaces of the bonding dielectric layer 1061 and the bonding connector 1062 are substantially leveled (or coplanar) and may be substantially flat. For example, the lower surface of the pad portion 1062b is substantially leveled (or coplanar) with the lower surface of the second dielectric sublayer 1061b, within process variations. In some embodiments, the TSV 105 and the via portion 1062a of the bonding connector 1062 are formed on opposing sides of the conductive pad 103.

With continued reference to FIG. 8, the second tier T2 may include a semiconductor substrate 201, a dielectric layer 202, a conductive pattern 203 embedded in the dielectric layer 202, a contact pad 204 disposed on and electrically connected to the conductive pattern 203, and a bonding structure 206 overlying the contact pad 204 and the dielectric layer 202 and bonded to the bonding structure 106 of the first tier Ti. Materials of the semiconductor substrate 201, the dielectric layer 202, the conductive pattern 203, and the bonding structure 206 may be the same as (or similar to) the materials of the corresponding elements in the first tier T1. In some embodiments, the integrated circuit devices (not shown) formed in/on the semiconductor substrate 201 and the conductive pattern 203 may be interconnected to perform one or more functions including memory structures, processing structures, sensors, amplifiers, power distribution, input/output circuitry, or the like. The contact pad 204 of the second tier T2 may be an aluminum pad or an aluminum-copper pad, and other metallic materials may be used. The first dielectric sublayer 2061a overlying the dielectric layer 202 may cover the contact pad 204 and also laterally cover the via portion 2062a of the bonding connector 206, where the via portion 2062a of the bonding connector 206 may directly land on the contact pad 204. The pad portion 2062b of the bonding connector 206 connected to the via portion 2062a may be laterally covered by the second dielectric sublayer 2061b overlying the first dielectric sublayer 2061a.

In some embodiments, the upper surfaces of the bonding dielectric layer 2061 and the bonding connector 2062 are substantially leveled (or coplanar) and may be substantially flat. For example, the lower surface of the pad portion 2062b is substantially leveled (or coplanar) with the lower surface of the second dielectric sublayer 2061b. The bonding structure 206 of the second tier T2 and the bonding structure 106 of the first tier T1 may be bonded together. In some embodiments, the bonding process is performed on the wafer level. That is, wafer-to-wafer bonding may be employed. For example, the bonding connector 1062 of the first tier T1 is substantially aligned with and fused to the bonding connector 2062 of the second tier T2, and the bonding dielectric layer 1061 of the first tier T1 is disposed on and fused to the bonding dielectric layer 2061 of the second tier T2. In some embodiments, the bonding interface IF1 of the first tier T1 and the second tier T2 is substantially flat since both of the bonding surfaces of the first tier T1 and the second tier T2 are substantially flat. For example, metal-to-metal bonds and dielectric-to-dielectric bonds (and dielectric-to-metal bonds, if any) are formed on the bonding interface IF1.

Still referring to FIG. 8, the semiconductor device 10 may include a bump pad 107 formed over the back side 101b of the semiconductor substrate 101 and connected to the TSV 105. In some embodiments, one or more insulating layer(s) 108 may be formed over the back side 101b of the semiconductor substrate 101 to cover the bump pad 107. For example, after bonding the first tier T1 to the second tier T2, a TSV revealing process may be performed to partially remove the back side of the semiconductor substrate 101 so that the TSV 105 may be slightly protruded from the back side 101b of the semiconductor substrate 101. The TSV 105 may protrude about a few microns from the back side 101b of the semiconductor substrate 101 and the top surface of the dielectric liner 104. In some embodiments, an insulating layer 1081 may be formed on the back side 101b of the semiconductor substrate 101 and the top surface of the dielectric liner 104 to laterally cover a top protruded portion of the TSV 105. The insulating layer 1081 may include silicon nitride, an oxide, silicon oxynitride, silicon carbide, a polymer, the like, etc. Subsequently, the bump pad 107 may be formed on the top protruded portion of the TSV 105 and the isolation layer 1081. In some embodiments, the bump pad 107 includes copper, nickel, palladium, aluminum, gold, alloys thereof, etc.

In some embodiments, the semiconductor device 10 may include at least one conductive bump 109 formed on the insulating layer 108 and extending into the insulating layer 108 to land on the bump pad 107. The conductive bump 109 may be or may include micro-bumps, controlled collapse chip connection (C4) bumps, metal pillars, solder balls, ball grid array (BGA) connectors, electroless nickel-electroless palladium-immersion gold (ENEPIG) formed bumps, or the like. The conductive bump 109 may include a conductive material such as solder, copper, aluminum, gold, nickel, silver, palladium, tin, the like, or a combination thereof. In some embodiments, the conductive bump 109 includes a pillar portion connected to the bump pad 107 and a cap portion formed on the pillar portion. Alternatively, the conductive bump 109 may include a bump shape or may have a substantially vertical sidewall. It is noted that the shape of the conductive bump 109 shown herein is provided for illustrative purposes, the conductive bump 109 may have various cross sections depending on the design requirements.

The formation of the semiconductor device 10 may involve wafer-to-wafer bonding, and a singulation process may be performed to form a plurality of the semiconductor devices 10. For example, the insulating layer 108, the underlying first tier T1, and the underlying second tier T2 are cut off to form a coterminous sidewall of the semiconductor device 10 as shown in FIG. 8. The semiconductor device 10 may be or may include a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The semiconductor device 10 may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

In accordance with some embodiments, a semiconductor structure includes a dielectric layer, a conductive pad embedded in the dielectric layer, a semiconductor substrate disposed on the dielectric layer and including a via opening with a notch in proximity to the dielectric layer, a TSV disposed in the via opening of the semiconductor substrate and extending into the dielectric layer to land on the conductive pad, and a dielectric liner disposed in the via opening of the semiconductor substrate and filling the notch to laterally separate the TSV from the semiconductor substrate. A surface of the dielectric liner facing the TSV is substantially leveled with an inner sidewall of the dielectric layer facing the TSV.

In accordance with some embodiments, a semiconductor device includes a first tier. The first tier includes a first semiconductor substrate including an upper inner sidewall and a lower inner sidewall connected to the upper inner sidewall, a first dielectric layer underlying the first semiconductor substrate, a first conductive pattern embedded in the first dielectric layer, a dielectric liner disposed on the upper inner sidewall and the lower inner sidewall of the first semiconductor substrate, and a TSV including an upper portion laterally covered by the dielectric liner and a lower portion laterally covered by the first dielectric layer and connected to the first conductive pattern. An upper portion of the dielectric liner overlying the upper inner sidewall is thinner than a lower portion of the dielectric liner overlying the lower inner sidewall.

In accordance with some embodiments, a manufacturing method of a semiconductor structure includes at least the following steps. A via opening is formed to penetrate through a semiconductor substrate overlying the dielectric material layer, where the via opening includes an upper region and a lower region connected to the upper region, and a notch of the lower region recessed into an inner sidewall of the semiconductor substrate. A dielectric liner material is formed in the via opening to laterally cover the semiconductor substrate and overlay the dielectric material layer. The via opening is extended by removing portions of the dielectric liner material and the dielectric material layer to accessibly reveal a conductive pad embedded in the dielectric material layer. A TSV is formed in the via opening to land on the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a dielectric layer;
a conductive pad embedded in the dielectric layer;
a semiconductor substrate disposed on the dielectric layer, the semiconductor substrate comprising a via opening with a notch in proximity to the dielectric layer;
a through substrate via (TSV) disposed in the via opening of the semiconductor substrate and extending into the dielectric layer to land on the conductive pad; and
a dielectric liner disposed in the via opening of the semiconductor substrate and filling the notch to laterally separate the TSV from the semiconductor substrate, and a sidewall of the dielectric liner facing the TSV being aligned with an inner sidewall of the dielectric layer facing the TSV.

2. The semiconductor structure of claim 1, wherein a cross section of the notch has a concave curved shape facing the TSV.

3. The semiconductor structure of claim 1, wherein a lower portion of the dielectric liner filling the notch is an annular ring encircling the TSV in a top view.

4. The semiconductor structure of claim 1, wherein the via opening of the semiconductor substrate comprises an upper region and a lower region connected to the upper region, the notch is at the lower region, and a maximum width of the upper region is less than a maximum width of the lower region.

5. The semiconductor structure of claim 4, wherein an opening width of the upper region of the via opening of the semiconductor substrate gradually decreases toward the lower region of the via opening of the semiconductor substrate.

6. The semiconductor structure of claim 1, wherein lateral surfaces of the dielectric liner and the dielectric layer are smoother than an inner sidewall of the semiconductor substrate defining the via opening.

7. The semiconductor structure of claim 1, wherein the TSV comprises:
a diffusion barrier layer being in direct contact with the dielectric liner and the dielectric layer;
a seed layer overlying the diffusion barrier layer; and
a conductive material layer filling the via opening of the semiconductor substrate.

8. The semiconductor structure of claim 7, wherein a combined thickness of the diffusion barrier layer and the seed layer is less than a maximum thickness of a portion of the dielectric liner filling the notch.

9. A semiconductor device, comprising:
a first tier comprising:
a first semiconductor substrate comprising an upper inner sidewall and a lower inner sidewall connected to the upper inner sidewall;
a first dielectric layer underlying the first semiconductor substrate;
a first conductive pattern embedded in the first dielectric layer;
a dielectric liner disposed on the upper inner sidewall and the lower inner sidewall of the first semiconductor substrate, wherein an upper portion of the dielectric liner overlying the upper inner sidewall is thinner than a lower portion of the dielectric liner overlying the lower inner sidewall;
a through substrate via (TSV) comprising an upper portion laterally covered by the dielectric liner and a lower portion laterally covered by the first dielectric layer and connected to the first conductive pattern; and
a first bonding structure underlying the first dielectric layer and connected to the first conductive pattern; and
a second tier disposed below the first tier, wherein the second tier comprises a second bonding structure fused to the first bonding structure.

10. The semiconductor device of claim 9, wherein the lower inner sidewall of the first semiconductor substrate has a cross sectional profile recessed toward the TSV.

11. The semiconductor device of claim 9, wherein a lateral surface of the dielectric liner connected to the TSV is substantially leveled with an inner sidewall of the first dielectric layer connected to the TSV.

12. The semiconductor device of claim 9, wherein a sidewall and a bottom surface of the lower portion of the TSV are in direct with the dielectric layer and the first conductive pattern, respectively.

13. The semiconductor device of claim 9, wherein the second tier further comprises:
a second semiconductor substrate underlying the second bonding structure;
a second dielectric layer between the second semiconductor substrate and the second bonding structure; and
a second conductive pattern embedded in the second dielectric layer.

14. The semiconductor device of claim 9, wherein a bonding interface of the first tier and the second tier is substantially flat and comprises metal-to-metal bonds and dielectric-to-dielectric bonds.

15. A manufacturing method of a semiconductor structure, comprising:
forming a via opening to penetrate through a semiconductor substrate overlying the dielectric material layer, wherein the via opening comprises an upper region and a lower region connected to the upper region, and a notch of the lower region recessed into an inner sidewall of the semiconductor substrate;
forming a dielectric liner material in the via opening to laterally cover the semiconductor substrate and overlay the dielectric material layer;
extending the via opening by removing portions of the dielectric liner material and the dielectric material layer to accessibly reveal a conductive pad embedded in the dielectric material layer; and
forming a through substrate via (TSV) in the via opening to land on the conductive pad, wherein forming the TSV comprises:
forming the TSV on a first sidewall of the dielectric liner material, a second sidewall of the dielectric material layer and a top surface of the conductive pad, wherein the first sidewall of the dielectric liner material is aligned with the second sidewall of the dielectric material layer.

16. The manufacturing method of claim 15, wherein extending the via opening comprises:
performing a dry etching process to remove a portion of the dielectric liner material overlying the dielectric material layer and a portion of the dielectric material layer underlying the portion of the dielectric liner material; and
performing a wet etching process to remove a remaining portion of the dielectric material layer overlying the conductive pad to accessibly reveal the conductive pad.

17. The manufacturing method of claim 15, wherein extending the via opening comprises:
performing a dry etching process to remove a portion of the dielectric liner material overlying the dielectric material layer and a portion of the dielectric material layer underlying the portion of the dielectric liner material until the conductive pad is accessibly revealed.

18. The manufacturing method of claim 15, wherein forming the via opening comprises:
performing a dry etching process on the semiconductor substrate, wherein the via opening stops at a top surface of the dielectric material layer.

19. The semiconductor device of claim 9, wherein the first bonding structure includes a bonding dielectric layer and a bonding connector embedded in the bonding dielectric layer, wherein the bonding connector includes a via portion connected to the first conductive pattern and a pad portion connected with the via portion.

20. The manufacturing method of claim 15, wherein the dielectric liner material is formed to have a horizontal portion of the dielectric liner material overlying the dielectric material layer being thicker than a upper portion of the dielectric liner material laterally covering the semiconductor substrate.

* * * * *